United States Patent [19]
Belcher et al.

[11] Patent Number: 5,760,646
[45] Date of Patent: Jun. 2, 1998

[54] FEED-FORWARD CORRECTION LOOP WITH ADAPTIVE PREDISTORTION INJECTION FOR LINEARIZATION OF RF POWER AMPLIFIER

[75] Inventors: Donald K. Belcher; Michael A. Wohl; Kent E. Bagwell, all of Rogersville, Tenn.

[73] Assignee: Spectrian, Sunnyvale, Calif.

[21] Appl. No.: 685,222

[22] Filed: Jul. 23, 1996

Related U.S. Application Data

[63] Continuation-in-part of Ser. No. 626,239, Mar. 29, 1996.
[51] Int. Cl.⁶ .................................................. H03F 1/32
[52] U.S. Cl. ............................................. 330/149; 330/151
[58] Field of Search ............................... 330/149, 151; 375/297; 455/63

[56] References Cited

U.S. PATENT DOCUMENTS

| | | |
|---|---|---|
| 4,943,783 | 7/1990 | Nojima .......................... 330/151 X |
| 5,157,345 | 10/1992 | Kenington ....................... 330/151 X |

*Primary Examiner*—James B. Mullins
*Attorney, Agent, or Firm*—Charles E. Wands

[57] ABSTRACT

A linearization scheme for an RF power amplifier combines an adaptive predistortion modulator with a feedforward error correction loop, which cancels noise imparted by predistortion modulation to the amplified signal, and minimizes distortion in the RF amplifier's output to a level that allows the use of a low cost auxiliary RF error amplifier in the feed-forward loop. The predistortion correction mechanism produces a predistortion signal based upon the input signal and is adaptively adjusted by an error signal extracted from the output of the a main RF power amplifier. The input signal is supplied to a work function generator unit and to a subtraction unit, which is also coupled to receive a fractional portion of the amplifier output signal and outputs the RF error component. The RF error component is coupled to a predistortion function generator, which is driven by the work function generator unit. The predistortion modulator uses the output of the predistortion function generator to predistort the input signal by a compensation characteristic equal and opposite to the distortion expected at the output of the main RF amplifier. When subjected to the transfer function of the RF amplifier, the predistortion signal injected into the input signal path will effectively cancel the amplifier's anticipated distortion behavior. The predistortion is made adaptive by tracking the error signal and coupling this error signal to the predistortion function generator.

19 Claims, 6 Drawing Sheets

FEED-FORWARD CORRECTION LOOP WITH ADAPTIVE PREDISTORTION INJECTION FOR LINEARIZATION OF RF POWER AMPLIFIER

CROSS-REFERENCE TO RELATED APPLICATIONS

The present invention is a continuation-in-part of our U.S. patent application, Ser. No. 08/626,239(hereinafter referred to as the '239 application), filed Mar. 29, 1996, entitled: "Adaptive Compensation of RF Amplifier Distortion by Injecting Predistortion Signal Derived from Respectively Different Functions of Input Signal Amplitude," assigned to the assignee of the present application, and the disclosure of which is incorporated herein.

FIELD OF THE INVENTION

The present invention relates in general to communication systems, and is particularly directed to a combined adaptive RF power amplifier predistortion mechanism and feed-forward error correction loop for effectively linearizing—canceling amplitude and phase distortion—the operation of a microwave/RF power amplifier.

BACKGROUND OF THE INVENTION

In order to minimize the cost of RF communication system infrastructures, such as those employed in cellular and public communication service (PCS) communication environments, system operators are currently seeking microwave/RF power amplifier designs that will accommodate a multiplicity of carrier frequencies, while still complying with the stringent linearity requirements imposed upon cellular and PCS communications bands.

Because RF power amplifiers are inherently non-linear devices, they generate unwanted intermodulation products, which manifest themselves as spurious signals in the amplified output signal, separate and distinct from the input signal. A further source of amplifier distortion is the presence of spectral regrowth or spreading of a compact spectrum into spectral regions that do not appear in the input signal. The distortion introduced by an RF amplifier causes the phase and amplitude of its amplified output signal to depart from the respective phase and amplitude of the input signal, and may be considered as an incidental (and undesired) amplifier-sourced modulation of the input signal.

Prior art attempts to account for these sources of RF amplifier throughput degradation include the installation of a 'post-processing' feed-forward correction coupled with the amplifier's output signal, and 'pre-processing', in particular, predistortion of the amplifier's input signal. The purpose of a post-processing feed-forward correction loop is to extract the amount of error (distortion) present in the RF amplifier's output signal, amplify that extracted distortion signal to the proper level, and then reinject (the complement of) the amplified error signal back into the output path of the amplifier, such that (ideally) the amplifier distortion is effectively canceled. Unfortunately, amplifying the extracted distortion signal to the proper level that will achieve its cancellation from the original amplified output signal customarily requires the use of an auxiliary RF amplifier having a significant amount of gain, which implies substantial cost.

A predistortion mechanism, on the other hand, rather than performing post-processing of the amplifier's output signal, serves to inject a 'predistortion' signal into the RF amplifier's input signal path, the predistortion signal having a characteristic that has been predetermined to be ideally equal and opposite the distortion expected at the output of the amplifier, so that when subjected to the transfer function of the RF amplifier, it will effectively cancel its anticipated distortion behavior. The predistortion mechanism may be made adaptive by extracting the error signal component in the output of the RF amplifier and adjusting the predistortion signal in accordance with the such extracted error behavior of the RF amplifier during real time operation, so as to effectively continuously minimize distortion in the amplifier's output.

The above-referenced '239 application describes a particularly useful adaptive predistortion mechanism, which employs the envelope-dependency of the distortion-introducing behavior of the RF power amplifier to generate and iteratively adjust work function-based predistortion signals. These work function-based predistortion signals are then used to controllably predistort the phase and amplitude components of the input signal to the RF amplifier, so as to minimize the error in the amplifier output and thereby effectively compensate for the inherent distortion behavior of the amplifier.

SUMMARY OF THE INVENTION

In accordance with the present invention, by taking advantage of the functionality of an adaptive predistortion mechanism, such as that described in the above-referenced '239 application, and combining it with a feed-forward error correction loop, we have found that it is possible to not only effectively cancel out-of-band and any wideband noise that may be imparted by the predistortion modulation to the amplified signal, but to minimize the distortion component in the RF amplifier's output signal to such a diminished level that will allow the use of a reduced complexity and low cost auxiliary RF error amplifier in the feed-forward loop.

The predistortion correction mechanism preferably includes a predistortion modulator which produces a predistortion signal based upon the input signal $S_{in}(t)$ to be amplified and is adaptively adjusted by an error signal extracted from the output of the a main RF power amplifier whose distortion behavior is to be effectively canceled. For this purpose, the input signal is supplied to a work function generator unit and to a subtraction unit, which is also coupled to receive a fractional portion of the amplifier output signal $S_{out}=KS_{in}(t)+E(t)$, so that it outputs only the RF error term $E(t)$.

This RF error term $E(t)$ is coupled to a predistortion function generator, which is driven by the work function generator unit, and the output of which is coupled to the predistortion modulator. The predistortion function generator is operative to generate a prescribed predistortion function, such that the input signal $S_{in}(t)$ is modified or predistorted by a compensation characteristic that has been predetermined to be equal and opposite to the distortion expected at the output of the main RF amplifier.

As a consequence, when subjected to the transfer function of the main RF amplifier, the predistortion signal injected into the input signal path will effectively cancel the anticipated amplifier distortion behavior. The predistortion is made adaptive by tracking the error signal and coupling this error signal to the predistortion function generator, so that the predistortion function that is supplied to predistortion modulator is updated with monitored variations in the error signal component of the amplifier output.

In order to effectively cancel what is a 'predistortion-reduced' error signal component $E(t)$, the output signal $S_{out}(t)$ of the main RF amplifier is coupled to feed-forward correction loop. The feed-forward correction loop includes a further subtraction unit coupled to the output of the main RF amplifier and to the output of an auxiliary RF error amplifier, which is coupled to receive the error signal component E(t). The post-processing feed-forward correction loop is coupled to receive the error signal E(t) that has been extracted from the main RF amplifier's output signal $S_{out}(t)$, amplifies that extracted distortion signal E(t) to the proper level, and then reinjects the amplified error signal E(t) back into the output path of the main RF amplifier, such that the amplifier distortion signal component E(t) is effectively canceled from the output signal $S_{out}(t)$. Because the error signal component E(t) in the main RF amplifier's output signal has been significantly reduced to a very low or minimal level by the predistortion mechanism installed upstream of the main RF amplifier, the gain imparted by the auxiliary RF error amplifier to the error signal E(t) need not be on the order of that provided by the main RF amplifier, so that auxiliary RF error amplifier can be implemented using relatively reduced complexity and low cost circuitry.

When the predistortion correction mechanism is implemented in the manner described in the '239 application, the predistortion signal is based upon the envelope-dependency of the distortion-introducing behavior of the main RF power amplifier. The modulator may comprise a pair of gain and phase adjustment circuits, such as a fast variable attenuator and a fast phase shifter, respectively, coupled in cascade in the signal path to the input of the RF amplifier. These gain and phase adjustment circuits predistort the phase and amplitude components of the input signal to the RF amplifier, in accordance with predistortion control signals that are derived from respectively different work functions of the instantaneous amplitude of the input signal to the RF power amplifier.

Each work function signal may be controllably weighted in a weighting coefficient multiplier unit, by respective amplitude and phase component-associated weighting coefficients generated by a weighting coefficient generator, in accordance with an error measurement conducted on the amplifier output signal. The error measurement may be carried out in the time domain, as by way of a coherent receiver comparing the amplifier input and output signals, to derive respective amplitude and phase error signals.

The error measurement may alternatively be carried out in the frequency domain by a spectral measurement unit, which looks for the presence of energy in a prescribed portion of the frequency spectrum of the amplifier output signal, to determine whether the frequency spectrum of the output signal has departed from that of the frequency spectrum of the input signal. The amount of energy in a band pass filter employed by the spectral measurement is indicative of spectral distortion, rather than the desired signal, and is therefore representative of error. The error measurement is then coupled to the weighting coefficient generator, which is operative adjust the weighting coefficients,in such a manner as to minimize the measured error.

DETAILED DESCRIPTION

Figure 1:
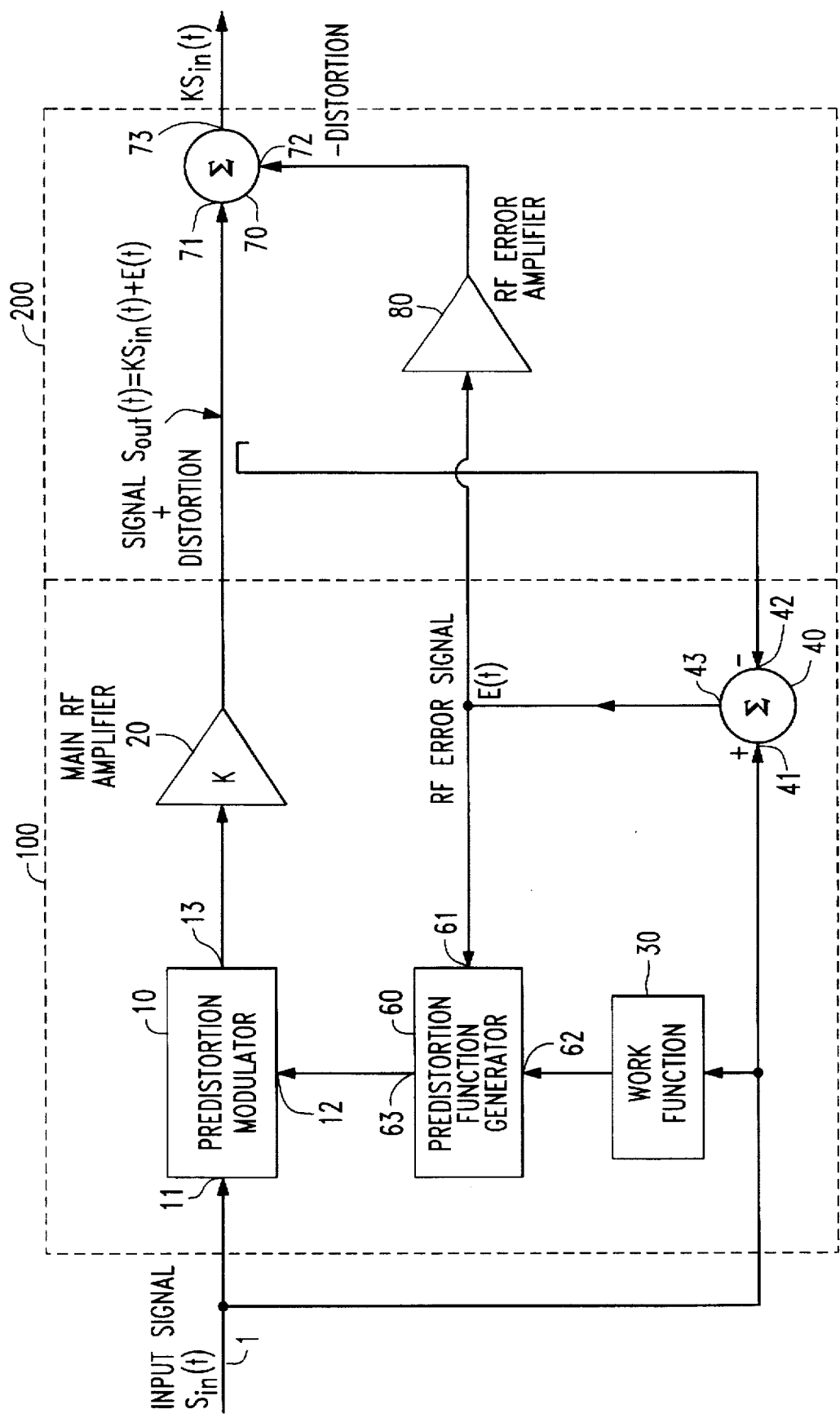
FIG. 1 diagrammatically illustrates a non-limiting example of an RF power amplifier signal processing system that combines an adaptive predistortion correction mechanism with a feed-forward error correction loop.

Before describing in detail the combined adaptive RF power amplifier predistortion mechanism and feed-forward error correction loop in accordance with the present invention, it should be observed that the present invention resides primarily in what is effectively a prescribed arrangement of conventional RF amplifier circuitry components, together with associated signal processing components (such as function generator circuits) and attendant supervisory control circuitry therefor, that controls the operations of such associated signal processing components. Consequently, the configuration of such circuitry and components, and the manner in which they are interfaced with other communication equipment have, for the most part, been illustrated in the drawings by a readily understandable block diagrams, which shows only those specific details that are pertinent to the present invention, so as not to obscure the disclosure with details which will be readily apparent to those skilled in the art having the benefit of the description herein. Thus, the block diagram illustrations are primarily intended to show the major components of the predistortion compensation arrangement in a convenient functional grouping, whereby the present invention may be more readily understood.

FIG. 1 diagrammatically illustrates a non-limiting example of an RF power amplifier signal processing system that combines an adaptive predistortion correction mechanism and a feed-forward error correction loop in accordance with the present invention. It may be noted that in the diagrammatic illustration of FIG. 1 and other Figures, power divider and insertion delay compensation circuitry that is included in the various signal flow paths, as appropriate, has not necessarily been illustrated in order to simplify the drawings.

As shown in FIG. 1, an input signal $S_{in}(t)$ to be amplified by a main RF amplifier 20, whose distortion behavior is to be effectively canceled, is supplied over an input link 1 to a predistortion correction mechanism shown in broken lines 100. Predistortion correction mechanism includes a predistortion modulator 10 having a first input 11 coupled to receive the input signal $S_{in}(t)$, and an output 13 coupled to main RF power amplifier 20. Input signal link 1 is further coupled to a work function generator unit 30 and to a first (+) input 41 of a subtraction unit 40. A second (−) input 42 of subtraction unit 40 is derived from a fractional portion of the output signal $S_{out}=KS_{in}(t)+E(t)$ produced by RF power amplifier 20 by an amount that yields an exact replica of the input signal $S_{in}(t)$ plus a (1/K) fractional value of an accompanying distortion/error signal E(t).

Since the RF amplifier output signal $S_{out}(t)$ is a combination of an amplified version of the input signal $S_{in}(t)$ and the distortion or noise term E(t), the output 43 of the subtraction unit 40 will contain only to the RF error term E(t). This RF error term E(t) is coupled to a first input 61 of a predistortion function generator 60. The output 63 of predistortion function generator 60 is coupled to a second input 12 of predistortion modulator 10. A second input 62 of predistortion function generator 60 is derived from the work function generator unit 30.

Predistortion function generator 60 is operative to generate a prescribed predistortion function, based upon the work function supplied to it by work function generator unit 30. This prescribed predistortion function is then coupled to predistortion modulator 10, so that the input signal $S_{in}(t)$ may be pre-processed or modified prior to being subjected to the transfer function of RF amplifier 20. As described briefly above, such predistorting of the input signal $S_{in}(t)$ is intended to impart thereto a compensation characteristic that has been predetermined to be ideally equal and opposite the distortion expected at the output of the amplifier 20, so that when subjected to the transfer function of the RF amplifier, the predistortion signal will effectively cancel its anticipated distortion behavior. The predistortion is made adaptive by tracking the error signal E(t) at the output 43 of the subtraction unit 40 and coupling this error signal to the predistortion function generator 60, so that the predistortion function that is supplied to predistortion modulator 10 is updated with monitored variations in the error signal component of the amplifier output.

Although the error signal component E(t) in the amplifier output signal $S_{out}(t)$ is greatly reduced by operation of the predistortion modulator 10, it is not entirely eliminated. In order to effectively cancel what is now a 'predistortion-reduced' error signal component E(t), the output signal $S_{out}(t)$ of the main RF amplifier 20 is coupled to feed-forward correction loop 200. Feed-forward correction loop 200 includes a further subtraction unit 70 having a first input 71 coupled to the output of the main RF amplifier 20 and a second input 72 coupled to the output of an auxiliary RF error amplifier 80. Auxiliary RF error amplifier 80 is coupled to receive the error signal component E(t) produced at the output 43 of subtractor 40.

As described briefly above, the post-processing feed-forward correction loop 200 is coupled to receive a fractional portion of the error signal E(t) that has been extracted from the main RF amplifier's output signal $S_{out}(t)$, amplifies that extracted distortion signal E(t) to the proper level, and then reinjects the amplified error signal E(t) back into the output path of the main RF amplifier 20 (via the (−) input 72 of further subtraction unit 70), such that at the output 73 of further subtraction unit 70 the amplifier distortion signal component E(t) is effectively canceled from the output signal $S_{out}(t)$. Because the error signal component E(t) in the main RF amplifier's output signal has been significantly reduced to a very low or minimal level by the predistortion mechanism 100 installed upstream of the main RF amplifier 20, the gain imparted by the auxiliary RF error amplifier 80 to the error signal E(t) need not be on the order of that provided by the main RF amplifier 20, so that auxiliary RF error amplifier 80 can be implemented using relatively reduced complexity and low cost RF amplifier circuitry.

Figure 2:
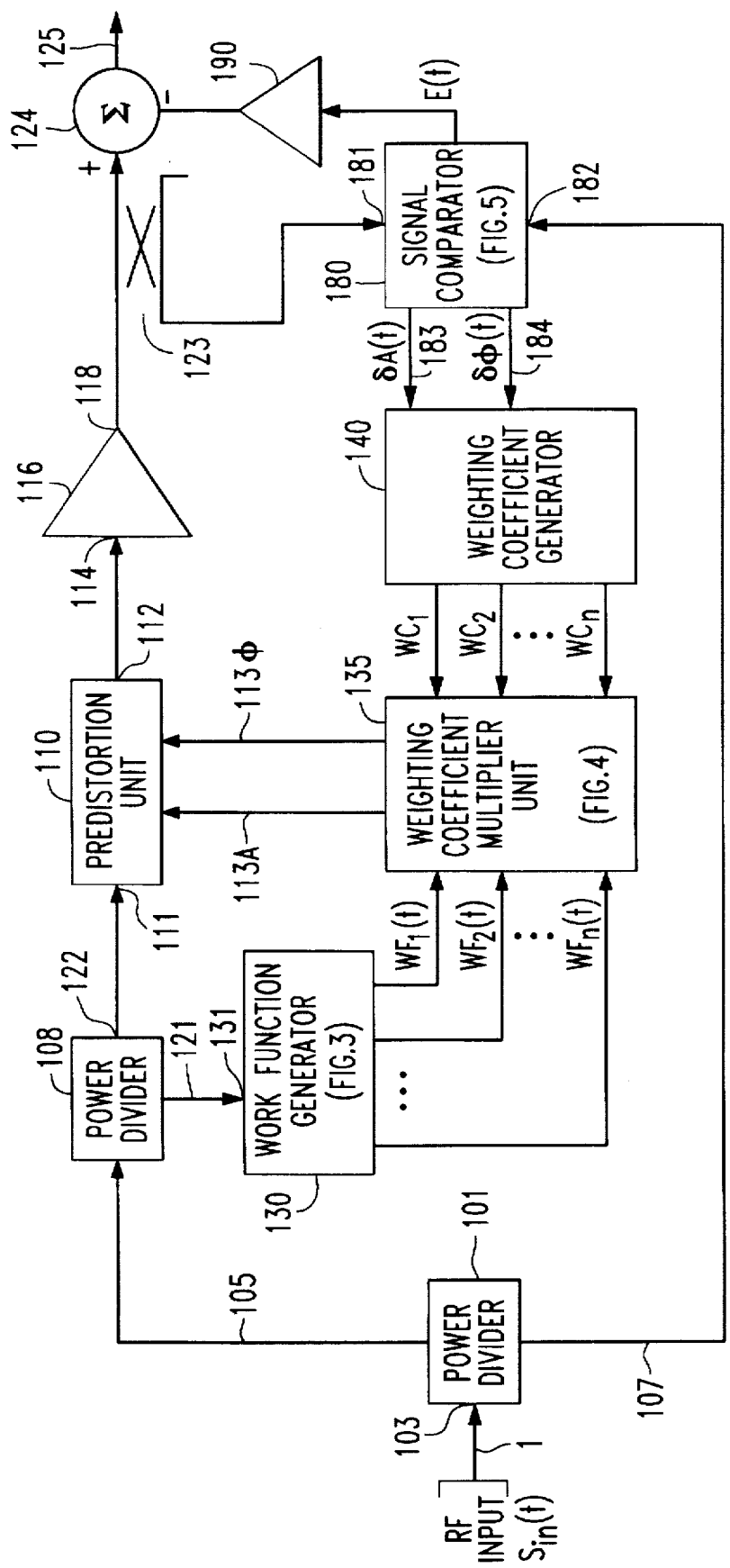
FIG. 2 diagrammatically illustrates a non-limiting example of circuitry for implementing the RF power amplifier signal processing system of FIG. 1, which incorporates the signal envelope-dependent, adaptive predistortion correction mechanism described in the above-referenced '239 application, for generating and iteratively adjusting work function-based predistortion signals used by the predistortion modulator.

FIG. 2 diagrammatically illustrates a non-limiting example of circuitry for implementing the RF power amplifier signal processing system of FIG. 1, which incorporates the signal envelope-dependent, adaptive predistortion correction mechanism described in the above-referenced '239 application, for generating and iteratively adjusting work function-based predistortion signals used by the predistortion modulator 10.

As shown therein the input signal link 1 is coupled to an input 103 of an input power divider 101, which splits or divides the input signal $S_{in}(t)$ into two signal paths 105 and 107. The first or main signal path 105 through the RF amplifier 116 imparts an insertion delay of τ seconds to the input signal $S_{in}(t)$. The first signal path 105 includes a further power divider 108, a first output 121 of which is coupled to an input 131 of a work function generator unit 130, which corresponds to the work function generator 30 of the system diagram of FIG. 1. A second output 122 of the power divider 108 is coupled to an input 111 of an input signal predistortion unit 110, which corresponds to the predistortion modulator 10 of the system diagram of FIG. 1.

The output 112 of the input signal predistortion unit 110 is coupled to the input 114 of an RF power amplifier 116, which corresponds to the main RF power amplifier 20 of FIG. 1. The output 118 of the RF power amplifier 116, from which an output signal $S_{out}(t)$ is derived, is coupled through a directional coupler 123 to a combining unit 124, which corresponds to subtraction unit 70 in the system diagram of FIG. 1. In addition to passing the amplified output signal $S_{out}(t)$ to downstream combining unit 124 of the feed-forward correction loop, directional coupler 123 supplies a fractional portion of the output signal to a first input 181 of signal comparator 180. Combining unit 124 is operative to reinject the (amplified) RF error signal component back into the output 118 of the main RF amplifier 116, such that at the output 125 of combining unit 124, the amplifier distortion signal component E(t) will have been effectively canceled from the output signal $S_{out}(t)$ produced by the main RF amplifier 116.

For this purpose, combining unit 124 is coupled to the output of a relatively low gain auxiliary RF error signal amplifier 190, which corresponds to error amplifier 80 in FIG. 1. As described previously, since the predistortion correction mechanism greatly reduces (by a factor of 20 dB or more) the error signal component E(t) in the main RF amplifier's output signal, the power range of the auxiliary RF error amplifier 190 need not be on the order of that of the main RF amplifier 20, so that auxiliary RF error amplifier 190 can be implemented using relatively reduced complexity and low cost circuitry. The output of the auxiliary RF error signal amplifier 190 is coupled to amplify the error signal output of a vector combiner within a signal comparator 180, (which corresponds to the subtraction unit 40 in FIG. 1, and is shown in detail in FIG. 5, to be described).

In a non-limiting embodiment, the input signal predistortion unit 110 may comprise a pair of gain and phase adjustment circuits, such as a fast variable attenuator and a fast phase shifter, coupled in cascade in the signal path 105 to the input of the RF amplifier. As will be described, these gain and phase adjustment circuits are operative to predistort the phase and amplitude components of the input signal $S_{in}(t)$ to the RF amplifier 116, in accordance with predistortion control signals that are derived from respectively different work functions of the instantaneous amplitude of the input signal to the RF power amplifier. These work function signals are adaptively adjusted (by processor control of the weighting coefficients WCi) to minimize the error as measured by the signal comparator 180, which error is representative of the distortion introduced by the RF amplifier.

Figure 3:
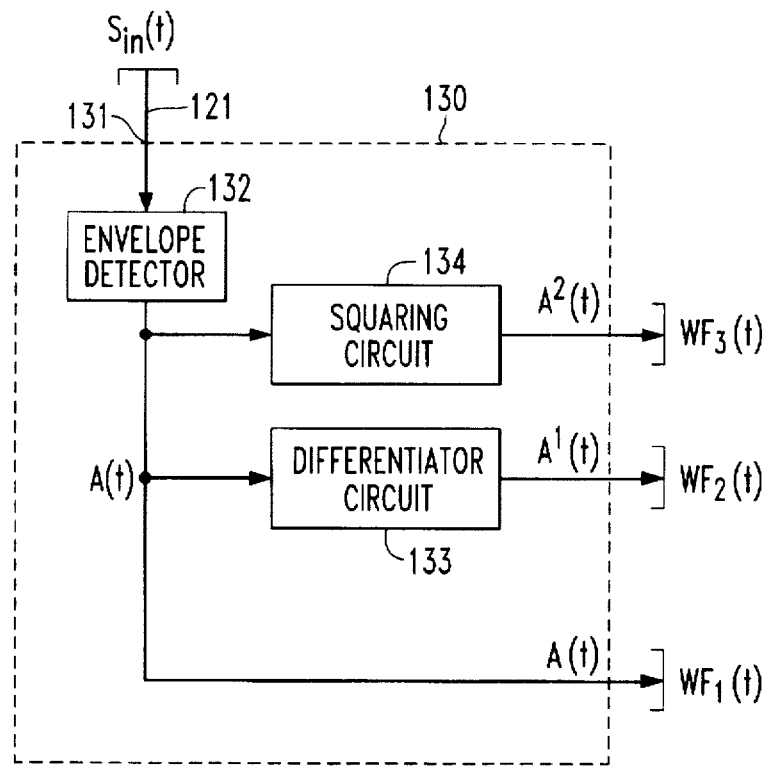
FIG. 3 diagrammatically illustrates examples of the types of instantaneous amplitude-based work functions that may be generated by the work function generator unit 130 of FIG. 2.

The work function generator unit 130 is operative to generate a plurality of respectively different work function-representative signals $WF_1(t)$, $WF_2(t)$, ..., $WF_n(t)$, each of which may be a function of the instantaneous amplitude of the input signal $S_{in}(t)$ being amplified by the RF power amplifier 116, as described in our above-referenced '239 application. Non-limiting examples of the types of instantaneous amplitude-based work functions that may be generated by the work function generator unit are diagrammatically illustrated in the circuit diagram of FIG. 3, as including a first work function signal $WF_1(t)$ derived from an envelope detector 132 to which input 131 is coupled.

The output of envelope detector 132 is directly proportional to the envelope or instantaneous amplitude $A(t)$ of the input signal $S_{in}(t)$. A second work function signal $WF_2(t)$ that is proportional to the derivative of the instantaneous amplitude $A'(t)$ of the input signal $S_{in}(t)$ is generated by a differentiator circuit 133, which is coupled to receive the output $A(t)$ of envelope detector 132. A third work function signal $WF_3(t)$ that is directly proportional to the square of the instantaneous amplitude $A^2(t)$ of the input signal $S_{in}(t)$ is derived from a squaring circuit 134, which is also coupled to receive the output $A(t)$ of envelope detector 132.

It should be observed that a respective work function signal $WF_i(t)$ generated by the work function generator unit 130 is not limited to the three types of signals described above and illustrated in FIG. 3, nor must the work function generator necessarily include such signals, in order to provide the adaptive distortion compensation of the present invention. Other types of signals may also be employed, such as a signal $A''(t)$ proportional to the derivative of the derivative (double derivative) of the instantaneous amplitude $A(t)$ of the input signal $S_{in}(t)$, a signal $A^3(t)$ proportional to the cube of the instantaneous amplitude $A(t)$ of the input signal $S_{in}(t)$, and a signal $(M-A(t))$ proportional to a constant M minus the instantaneous amplitude $A(t)$ of the input $S_{in}(t)$, as further non-limiting examples.

As further illustrated in FIG. 2, prior to being combined to form respective amplitude and phase predistortion control signals that are applied to the gain and phase adjustment circuits within the predistortion unit 110, each work function signal $WF_i(t)$ is controllably weighted or scaled in a weighting coefficient multiplier unit 135, which corresponds to the predistortion function generator 60 in the system diagram of FIG. 1, and is operative to multiply each of the work function signals by respective amplitude and phase associated weighting coefficients $WC_{Ai}$ and $WC_{\phi i}$ generated by a weighting coefficient generator 140 in accordance with error measurement outputs produced by error measuring signal comparator 180. The respective products (of the amplitude and phase associated weighting coefficients times the work function signals) are then summed into respective amplitude and phase predistortion control signals. These amplitude and phase distortion control signals (or phase quadrature (I and Q) signals) are coupled over lines 113A and 113φ and applied to predistortion unit 110 so as to controllably modulate the amplitude and phase of the input signal $S_{in}(t)$ in a manner that introduces a complement of the distortion effect of the RF amplifier 116 on the input signal.

As described in the '239 application, the signal processing mechanism through which work function signals are controllably weighted and combined to predistort the input signal is analogous to the technique employed in a transversal filter structure of an adaptive equalizer to reduce or cancel distortion introduced into a signal propagation path. In the present invention, however, rather than being derived from successive taps of a delay line, each work function signal $WF_i(t)$ is generated as a respectively different function $F(A(t))$ of the instantaneous amplitude/envelope $A(t)$ of the input signal $S_{in}(t)$.

Figure 4:
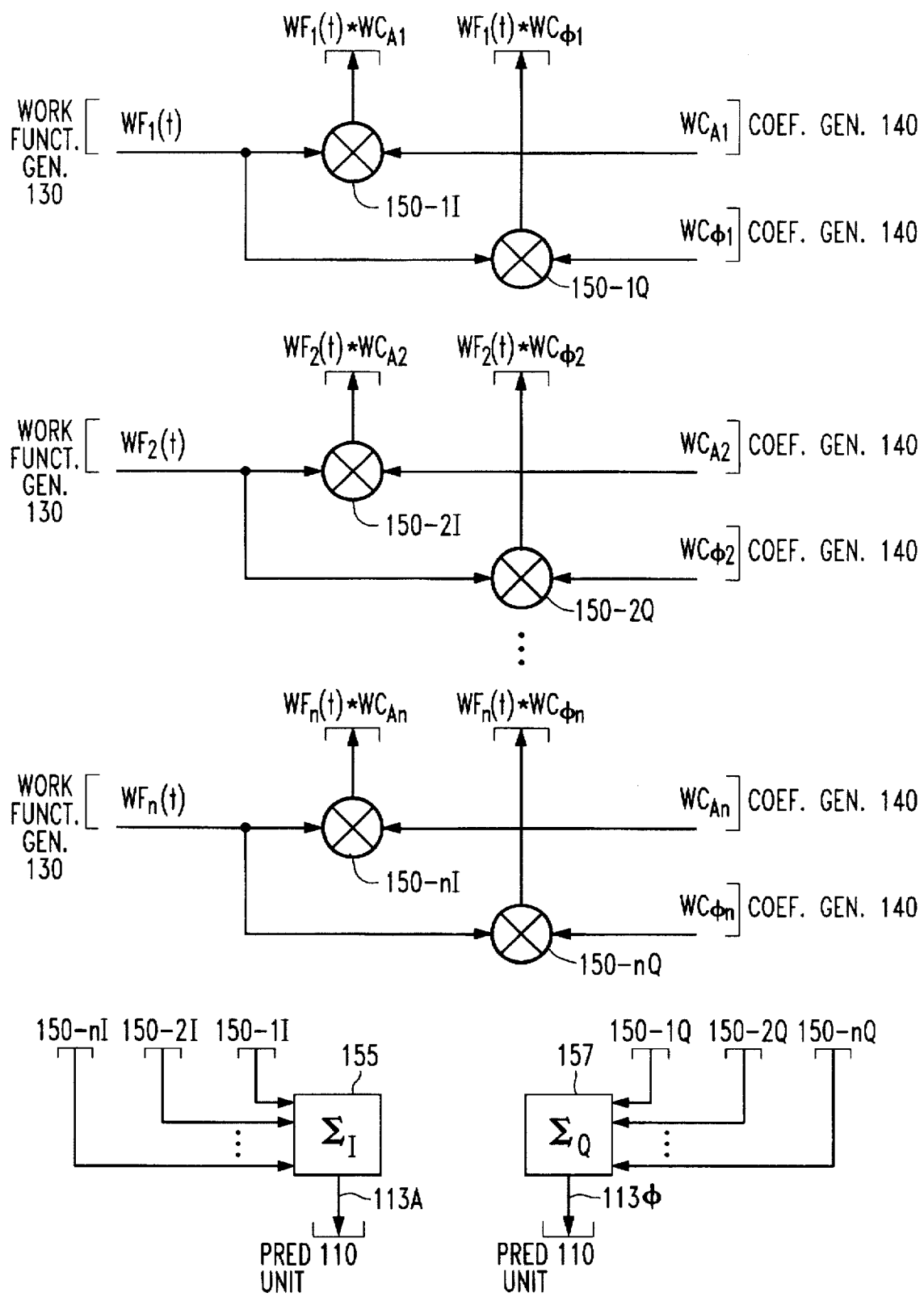
FIG. 4 diagrammatically illustrates the weighting coefficient multiplier unit 135 of FIG. 2.

To this end, as shown in FIG. 4, the respectively different work function-representative signals $WF_1(t)$, $WF_2(t)$, ..., $WF_n(t)$, as generated by work function generator unit 130 are applied as first inputs of respective pairs of in-phase and quadrature weighting coefficient multipliers 150-1I/150-1Q, 150-2I/150-2Q, ..., 150-nI/150-nQ. Each in-phase weighting coefficient multiplier 150-iI has a second input coupled to receive a respective amplitude weighting coefficient $WC_{Ai}$ from weighting coefficient generator 140; each quadrature-phase weighting coefficient multiplier 150-iQ has a second input coupled to receive a respective phase weighting coefficient $WC_{\phi i}$ from weighting coefficient generator 140. The outputs of multipliers 150 are therefore complex, scaled or weighted versions of the respectively different work function representative signals $WF_1(t)$, $WF_2(t)$, ..., $WF_n(t)$.

In addition to the multiplication operations carried out by the weighting coefficient multipliers 150, weighting coefficient multiplier unit 135 is operative to sum the respective in-phase (I) or amplitude (A) associated signal products, and the quadrature-phase (Q) or phase (φ) associated signal product outputs, as shown at $\Sigma_I$ summing unit 155 and $\phi_Q$ summing unit 157. The composite (summed) amplitude signal produced by summing unit 155 is coupled over line 113A to the gain adjustment circuit within predistortion unit 110, so as to control the injection of a predistorting amplitude signal component into the input signal $S_{in}(t)$. Likewise, the composite (summed) phase signal produced by summing unit 157 is coupled over line 113φ to the phase adjustment circuit within predistortion unit 110, so as to control the injection of a predistorting phase signal component into the input signal $S_{in}(t)$.

The weighting coefficient generator 140 may comprise a digital signal processor, and associated analog-to-digital circuits (ADCs) which interface input ports of the processor with the signal comparator 180, and digital-to-analog conversion circuits (DACs), which interface the processor with the respective weighting coefficient multipliers 150 within the weighting coefficient multiplier unit 135. The processor employed by weighting coefficient generator 140 is programmed to execute a conventional error minimization algorithm, which is operative to perturb or iteratively update the magnitudes and polarities of respective ones of the recursively adjustable weighting coefficients WC1, WC2, ..., WCn, so as to minimize the amplitude and phase difference signals δA(t) and δφ(t) supplied thereto by signal comparator 180. Non-limiting examples of error minimization algorithms that may be executed for this purpose include a least mean squares (LMS) algorithm, a steepest decent (gradient-following) algorithm, a perturbation correlation algorithm, and various (random) numerical search methods, and the like, and equivalents thereof.

Figure 5:
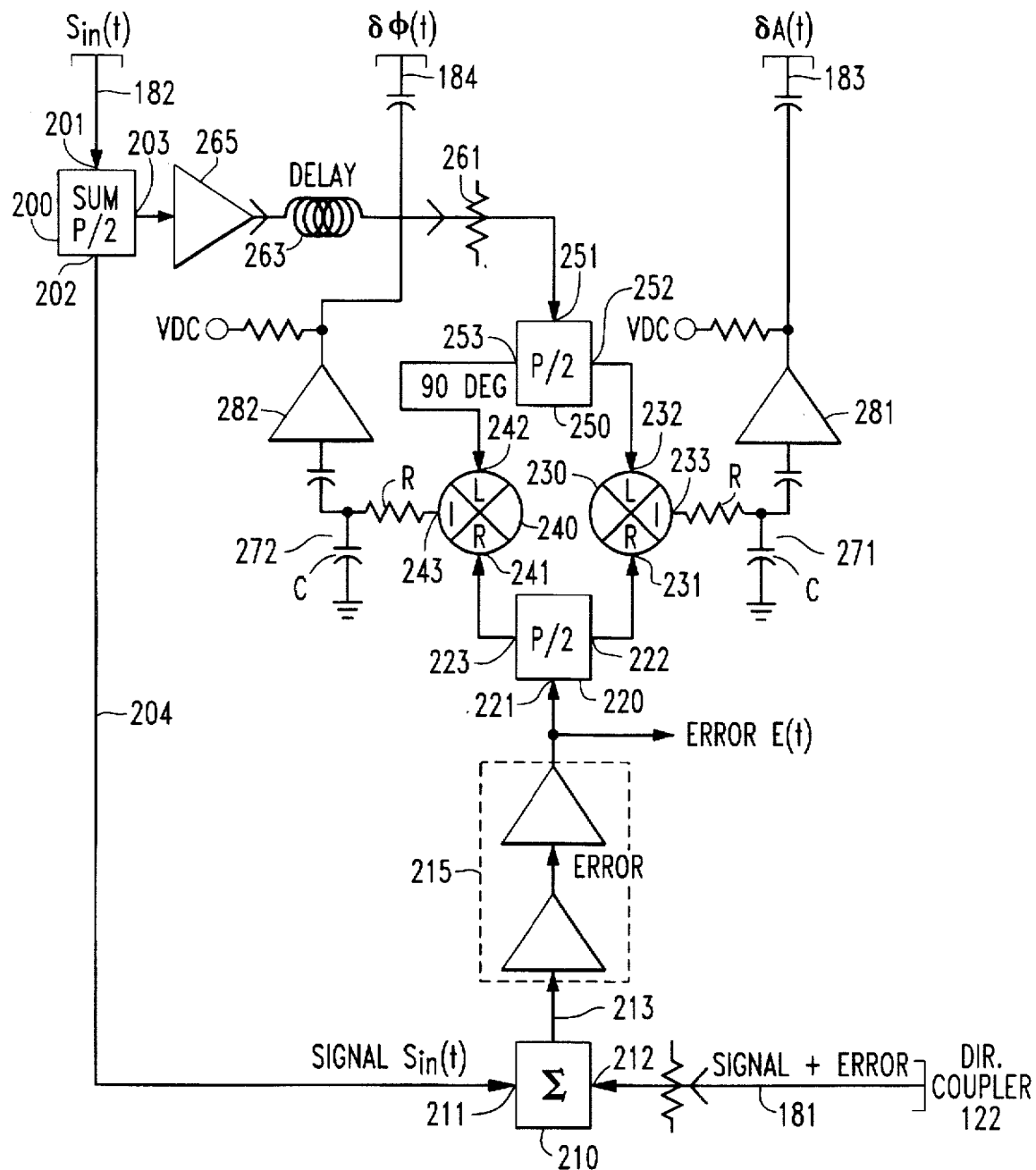
FIG. 5 schematically illustrates an implementation of a coherent receiver used to execute the functionality of the signal comparator 180 of FIG. 2.

In the illustrated example taken from the '239 application, measuring the error in the amplifier output signal $S_{out}(t)$ is effected by a signal comparator 180, which is a time domain device. One example of a time domain device is a coherent receiver, a non-limiting implementation of which is schematically illustrated in FIG. 5. The coherent receiver performs baseband processing of the delayed input signal $S_{in}(t)$ and the output signal $S_{out}(t)$, and generates amplitude and phase difference signal values δA(t) and δφ(t), that are respectively representative of the differences in the amplitude and phase components of the signals applied to inputs 181 and 182. These amplitude and phase difference signal values δA(t) and δφ(t) are coupled over respective output lines 183 and 184 to the weighting coefficient generator 140.

As shown in FIG. 5, signal input 182, to which the input signal $S_{in}(t)$ is applied via delay line 119 from power divider 101, is coupled to an input 201 of a power divider 200, a first output 202 of which is coupled over line 204 to a first input 211 of a vector combiner 210. A second input 212 of vector combiner 210 is coupled to input 181 from the directional coupler 123, and receives therefrom the amplifier output signal plus any error introduced into the desired signal. Since the signal component of the input 181 to vector combiner 210 is ideally at the same amplitude but 180° out of phase with the signal at input 182, the output 213 of vector combiner 210 should contain only an error term.

The output 213 of vector combiner is coupled through amplifier circuitry 215 and applied to an input 221 of a power divider 220. Power divider 220 has a first output 222 thereof coupled to a first port 231 of a mixer 230. Power divider 220 has its second output 223 thereof coupled to a first port 241 of a mixer 240. A second input 232 to mixer 230 is derived from a first output 252 of a quadrature power divider 250, a second output 253 of which is 90° out of phase with the first output 252 and is coupled to a second input 242 of mixer 240. Quadrature power divider 250 may comprise a quadrature hybrid, or a power divider coupled with a 90° phase shifter/delay line, or equivalent thereof. Quadrature power divider 250 has an input 251 coupled through an attenuator 261 and a delay 263 to the output of an amplifier 265, the input of which is coupled to the second output 203 of power divider 200. The respective outputs 233 and 243 of mixers 230 and 240 are coupled through integrator circuits 271 and 272, and buffer/amplifier circuits 281 and 282 to output lines 183 and 184.

Since the two inputs 231 and 232 of mixer 230 are effectively in-phase signal components, the multiplication of these two components in mixer 230 causes its output product (the undistorted signal times that part of the error component that is in-phase with the reference signal $S(t)$) to be representative of the amount of amplitude error. Conversely, since the two inputs 241 and 242 of mixer 240 are effectively 90° out of phase with one another, multiplication of these two components in mixer 240 causes its output product (a 90° delayed version of the undistorted signal times that part of the error component that is out of phase with the reference signal $S(t)$, namely a phase error component) to be representative of the amount of phase error.

Figure 7:
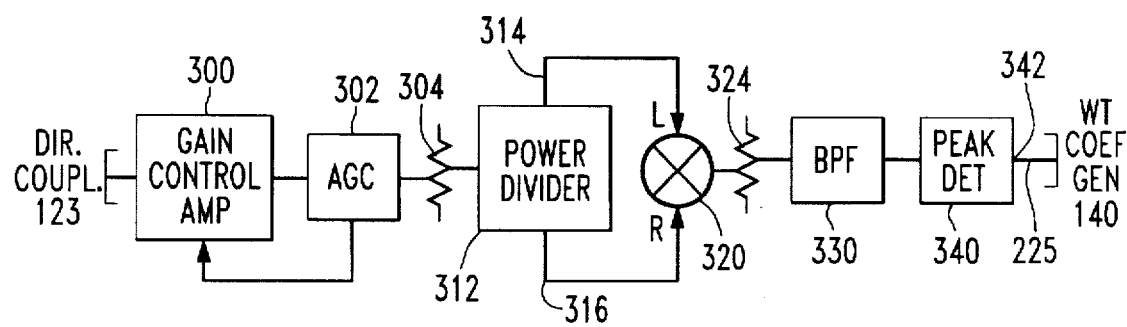
FIG. 7 is a detailed illustration of the spectral measurement unit 280 of FIG. 6.
Figure 6:
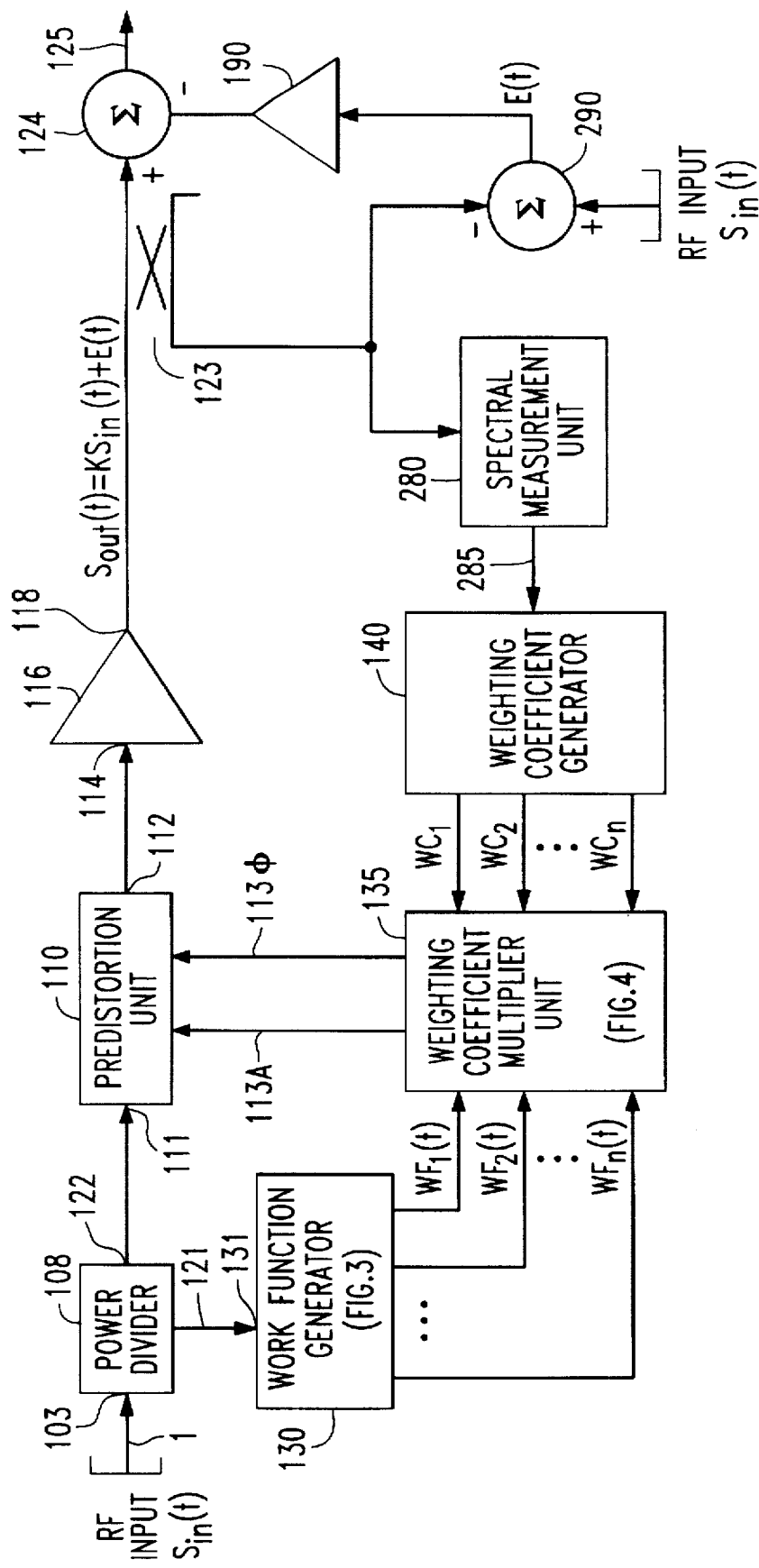
FIG. 6 diagrammatically illustrates an RF power amplifier circuit arrangement, which incorporates an adaptive distortion correction mechanism of a second embodiment of the present invention.

In an alternative embodiment, diagrammatically illustrated in FIGS. 6 and 7, measuring the error in the amplifier output signal $S_{out}(t)$ may be effected by means a frequency domain device. In the diagrammatic illustration shown in FIG. 6, the error measurement is carried out by a spectral measurement unit 280, shown in detail in FIG. 7, which looks for the presence of energy in a prescribed portion of the frequency spectrum of the amplifier output signal, as derived through directional coupler 123, to determine whether the frequency spectrum of the output signal has departed from that of the frequency spectrum of the input signal. The output of directional coupler 123 is further coupled to a feed-forward correction loop including a subtraction unit 290, which is also coupled to receive the RF input signal $S_{in}(t)$. The output of subtraction unit 290 is coupled to auxiliary amplifier 190 as in FIG. 2.

The amount of energy in a low frequency (baseband) filter within the spectral measurement unit 280 corresponds to the spectral distortion at the offset frequency, rather than the desired signal. This unwanted energy measurement output from unit 280 is coupled over line 285 to the weighting coefficient generator 140. In response to this energy value, the weighting coefficients generated by weighting coefficient generator 140 and supplied to the weighting coefficient multiplier unit 135 are adjusted to minimize the spectral regrowth component in the output of RF amplifier 116.

As shown in FIG. 7, a spectral measurement unit 280 comprises a gain control amplifier circuit 300, which is coupled to the directional coupler 123 at the output of the RF amplifier. The output of gain control amplifier 300 is coupled with an automatic gain control AGC circuit 302, which is operative to maintain the gain through amplifier 300 so as to prevent peaks in the signal being processed from saturating the operation of a downstream squaring circuit 320. The output of AGC circuit 302 is coupled through a power level setting pad 304, the output of which is coupled to a power divider 312. The two outputs 314 and 316 of power divider 312 are coupled to inputs of a squaring circuit implemented as mixer (multiplier) 320, the output of which is coupled through a power level setting pad 324 and applied to a band pass filter 330. The pass band of filter 330 is set to pass frequencies in an unwanted spectral regrowth band (undesired signal energy). Energy passed by the band pass filter 330 is coupled to a peak detector circuit 340, the output 342 of which is coupled to the weighting coefficient generator 140. This peak value (representative of unwanted energy in the RF amplifier output signal) is coupled over line 285 to the weighting coefficient generator 140.

Since energy passed by band pass filter is associated with unwanted signal, it is representative of error in the amplifier output. Weighting coefficient generator 140 executes an error minimization algorithm, such as one of the error minimization algorithms referenced previously, to adjust the weighting coefficients supplied to the weighting coefficient multiplier unit 135, so as to minimize the spectral regrowth component and thereby minimize error in the output of the RF amplifier.

As will be appreciated from the foregoing description, the RF power amplifier linearization scheme of the present invention takes advantage of the functionality of an adaptive predistortion mechanism, such as that described in the above-referenced '239 application, and combines it with a feed-forward RF amplifier error correction loop, making it is possible to effectively cancel out-of-band and wideband noise that may be imparted by the predistortion modulation to the amplified signal. In addition, the distortion component in the RF amplifier's output signal will have been minimized to such a diminished level to allow use of a reduced complexity and low cost auxiliary RF error amplifier in the feed-forward loop.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A method for correcting for distortion in an RF power amplifier comprising the steps of:
   (a) monitoring an input signal supplied to and an amplified output signal from by said RF power amplifier, and extracting therefrom a distortion signal that varies with a rate of variation of the envelope of said amplified output signal;
   (b) monitoring the instantaneous amplitude of said input signal to said amplifier, and generating at least one work function that varies with a variation of the instantaneous amplitude of said input signal;

c) generating a predistortion function in accordance with said distortion signal extracted in step (a) and said at least one work function of the instantaneous amplitude of said input signal as generated in step (b), so that said predistortion function varies with a rate of variation of the envelope of said amplified output signal;

(d) adaptively predistorting said input signal to be amplified by said RF amplifier at a rate of variation of the envelope of said amplified output signal, by predistorting said input signal by said predistortion function generated in step (c); and (e) subjecting said amplified output signal from said RF power amplifier to a feed-forward correction loop.

2. A method according to claim 1 wherein step (e) comprises combining said distortion signal extracted in step (a) with said amplified output signal from said RF power amplifier, so as to effectively cancel the distortion signal of said amplified output signal by said RF power amplifier.

3. A method according to claim 2, wherein step (e) comprises amplifying said distortion signal further extracted in step (a) by means of an auxiliary RF error amplifier having an operational power range less than that of said RF power amplifier.

4. A method according to claim 3, wherein said feed-forward correction loop includes a subtraction unit coupled to the output of said RF amplifier and to the output of said auxiliary RF error amplifier.

5. A method according to claim 1, wherein said predistortion function has a distortion compensation characteristic that is generally complementary to distortion expected at the output of said RF amplifier.

6. A method according to claim 5, wherein step (b) comprises generating a plurality of respectively different work functions of said monitored input signal, and step (c) comprises controllably adjusting said plurality of respectively different work functions in accordance with said distortion signal extracted in step (a), and generating said predistortion function in accordance with a combination of controllably adjusted respectively different work functions.

7. A method according to claim 6, wherein step (c) further comprises generating a plurality of weights in accordance with a distortion signal minimization mechanism that is operative to reduce said distortion signal, and adjusting said plurality of respectively different work functions in accordance with said weights.

8. A method according to claim 7, wherein step (a) further includes applying said input signal and said output signal to a coherent receiver to extract said distortion signal.

9. A method according to claim 1, wherein said predistortion function is controllably weighted by respective amplitude and phase component-associated weighting coefficients generated in accordance with said distortion signal in said RF amplifier's output signal.

10. A signal processing system for correcting for distortion in an RF power amplifier comprising:

a work function generator coupled to receive an input signal to be amplified by said RF power amplifier and being operative to generate at least one work function that varies with a variation of the instantaneous amplitude of said input signal; a distortion signal extraction unit which is coupled to monitor said input signal and an amplified output signal from by said RF power amplifier, and to extract therefrom a distortion signal that varies with a rate of variation of the envelope of said amplified output signal;

a predistortion function generator, coupled to said work function generator and to said distortion signal extraction unit, and being operative to generate a predistortion function in accordance with said distortion signal and said at least one work function of the instantaneous amplitude of said input signal, so that said predistortion function varies with a rate of variation of the envelope of said amplified output signal;

a predistortion modulator coupled in the path of an input signal to be amplified by said RF power amplifier, and being operative to adaptively predistort said input signal at a rate of variation of the envelope of said amplified output signal, by predistorting said input signal by said predistortion control function; and a feed-forward correction loop connected in circuit with an output of said RF power amplifier.

11. A signal processing system according to claim 10, wherein said feed-forward correction loop includes an RF error amplifier which amplifies said distortion signal extracted by said distortion signal extraction unit, and a signal combining unit which is coupled to subtract said distortion signal from said amplified output signal from said RF power amplifier, so as to effectively cancel the distortion signal in said amplified output signal from said RF power amplifier.

12. A signal processing system according to claim 11, wherein said RF error amplifier has an operational power range less than that of said RF power amplifier.

13. A signal processing system according to claim 10, wherein said predistortion function has a distortion compensation characteristic that is generally complementary to distortion expected at the output of said RF amplifier.

14. A signal processing system according to claim 10, wherein said predistortion modulator is operative to adaptively adjust respective amplitude and phase components of said input signal to be amplified by said RF power amplifier.

15. A signal processing system according to claim 10 wherein said work function generator is operative to generate a plurality of respectively different work functions of said input signal, said predistortion function generator is operative to controllably adjust said plurality of respectively different work functions in accordance with said distortion signal and to generate said predistortion function in accordance with a combination of controllably adjusted respectively different work functions.

16. A signal processing system according to claim 15, wherein said predistortion function generator is operative to generate a plurality of weights in accordance with a distortion signal minimization mechanism that reduces said distortion signal, and to adjust said plurality of respectively different work functions in accordance with said weights.

17. A signal processing system according to claim 10, wherein said distortion signal extraction unit includes a coherent receiver.

18. A signal processing system according to claim 10, wherein said distortion signal extraction unit is operative to measure energy in a prescribed spectral portion of the output signal produced by said RF amplifier, so as to derive a frequency domain measure of distortion contained in the output signal of said RF amplifier.

19. A signal processing system according to claim 10, wherein said distortion signal extraction unit includes a bandpass filter which has a frequency pass band exclusive of a desired frequency content of said output signal is and is operative to provide a measure of energy contained in said pass band indicative of distortion in the output signal amplified by said RF amplifier.

* * * * *